United States Patent
Huang

(10) Patent No.: US 8,043,098 B2
(45) Date of Patent: Oct. 25, 2011

(54) ELECTRONIC DEVICE WITH EMI SHIELD SPRING DEVICE

(75) Inventor: Mao-Sheng Huang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/752,130

(22) Filed: Apr. 1, 2010

(65) Prior Publication Data
US 2010/0311254 A1    Dec. 9, 2010

(30) Foreign Application Priority Data
Jun. 9, 2009    (CN) .................... 2009 1 0303093

(51) Int. Cl.
*H01R 13/648* (2006.01)
(52) U.S. Cl. .................................................. 439/95
(58) Field of Classification Search .......... 439/91, 439/95, 96; 174/354, 355, 51; 361/753, 361/799
See application file for complete search history.

(56) References Cited

U.S. PATENT DOCUMENTS

| | | | | |
|---|---|---|---|---|
| 3,258,649 A * | 6/1966 | Arguin et al. | ............... | 361/807 |
| 3,504,095 A * | 3/1970 | Roberson et al. | ............... | 174/355 |
| 4,823,235 A * | 4/1989 | Suzuki et al. | ............... | 361/816 |
| 5,004,866 A * | 4/1991 | Cooke et al. | ............... | 174/366 |
| 5,343,361 A * | 8/1994 | Rudy et al. | ............... | 361/710 |
| 5,513,996 A * | 5/1996 | Annerino et al. | ............... | 439/95 |
| 5,532,428 A * | 7/1996 | Radloff et al. | ............... | 174/351 |
| 5,747,735 A * | 5/1998 | Chang et al. | ............... | 174/51 |
| 5,833,480 A * | 11/1998 | Austin | ............... | 439/95 |
| 5,952,608 A * | 9/1999 | Kim | ............... | 174/354 |
| 5,978,232 A * | 11/1999 | Jo | ............... | 361/796 |
| 6,077,095 A * | 6/2000 | DelPrete et al. | ............... | 439/92 |
| 6,118,071 A * | 9/2000 | Munch et al. | ............... | 174/51 |
| 6,201,710 B1 * | 3/2001 | Bagung et al. | ............... | 361/799 |
| 6,301,124 B1 * | 10/2001 | Nikazm et al. | ............... | 361/799 |
| 6,320,120 B1 * | 11/2001 | Van Haaster | ............... | 174/369 |
| 6,525,266 B2 * | 2/2003 | Ferland et al. | ............... | 174/371 |
| 6,544,047 B2 * | 4/2003 | Moore | ............... | 439/95 |
| 6,674,018 B2 * | 1/2004 | Yumi | ............... | 174/267 |
| 6,813,165 B2 * | 11/2004 | Cheng et al. | ............... | 361/801 |
| 6,863,547 B2 * | 3/2005 | Park | ............... | 439/95 |
| 6,937,475 B2 * | 8/2005 | Rigimbal et al. | ............... | 361/752 |
| 6,946,598 B1 * | 9/2005 | Konshak | ............... | 174/354 |
| 7,085,139 B2 * | 8/2006 | Chen | ............... | 361/760 |
| 7,442,880 B2 * | 10/2008 | Naastrom et al. | ............... | 174/354 |
| 7,501,587 B2 * | 3/2009 | English | ............... | 174/354 |
| 7,692,932 B2 * | 4/2010 | Bisbikis et al. | ............... | 361/799 |
| 2002/0142632 A1 * | 10/2002 | Moore | ............... | 439/95 |
| 2003/0116337 A1 * | 6/2003 | Thompson et al. | ......... | 174/35 R |
| 2007/0114060 A1 * | 5/2007 | Barringer et al. | ............... | 174/354 |

* cited by examiner

*Primary Examiner* — Ross Gushi
(74) *Attorney, Agent, or Firm* — Altis Law Group, Inc.

(57) ABSTRACT

An electronic device comprises a circuit board, a conductive member, and a spring contact. The conductive member is spaced from the circuit board and comprises a surface opposite to the circuit board. The surface defines a recessed portion. The spring contact is connected to the conductive member and contacts the circuit board to achieve grounding. The spring contact comprises an end movably received in the recessed portion.

10 Claims, 4 Drawing Sheets

ELECTRONIC DEVICE WITH EMI SHIELD SPRING DEVICE

BACKGROUND

1. Technical Field

The present disclosure relates to an electronic device including an electro-magnetic interference (EMI) shield spring device.

2. Description of Related Art

EMI shield spring clips/contacts are known in the art, such as the EMI shield springs described in U.S. Pat. No. 5,532,428 to Radloff et al., U.S. Pat. No. 6,678,170 to Barringer et al., and U.S. Pat. No. 5,225,269 to Garrett. The EMI shield spring clips/contacts contact a circuit board and a conductive member of an electronic device to achieve grounding. In certain instances, the EMI shield spring contacts/clips may lack sufficient resilience due to assembly errors, which may result in the EMI shield spring contacts/clips failing to contact the circuit board or the conductive member.

What is needed is an EMI shield spring device to solve the aforementioned problems.

BRIEF DESCRIPTION OF THE DRAWINGS

The components in the drawings are not necessarily drawn to scale, the emphasis instead being placed upon clearly illustrating the principles of the electronic device having an EMI shield device. Moreover, in the drawings, like reference numerals designate corresponding parts throughout the several views.

DETAILED DESCRIPTION

Figure 1:
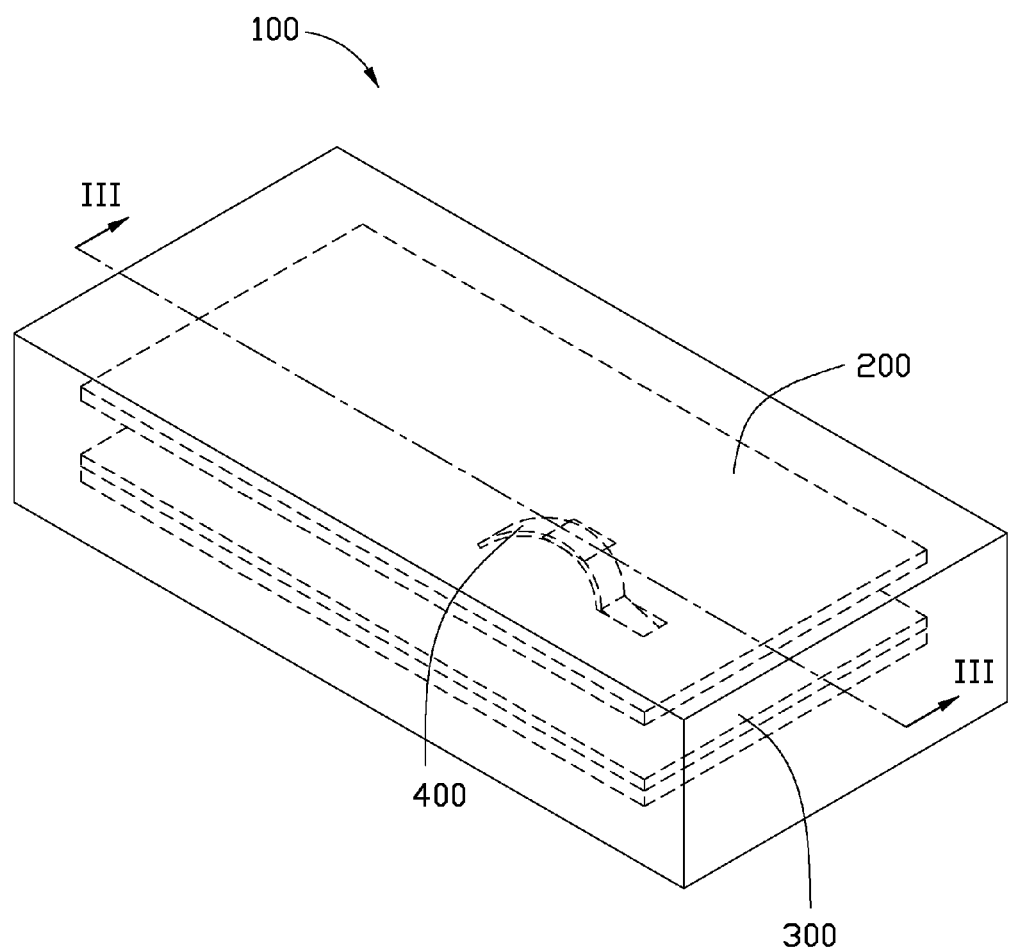
FIG. 1 is a schematic view of an electronic device in accordance with an exemplary embodiment.
Figure 2:
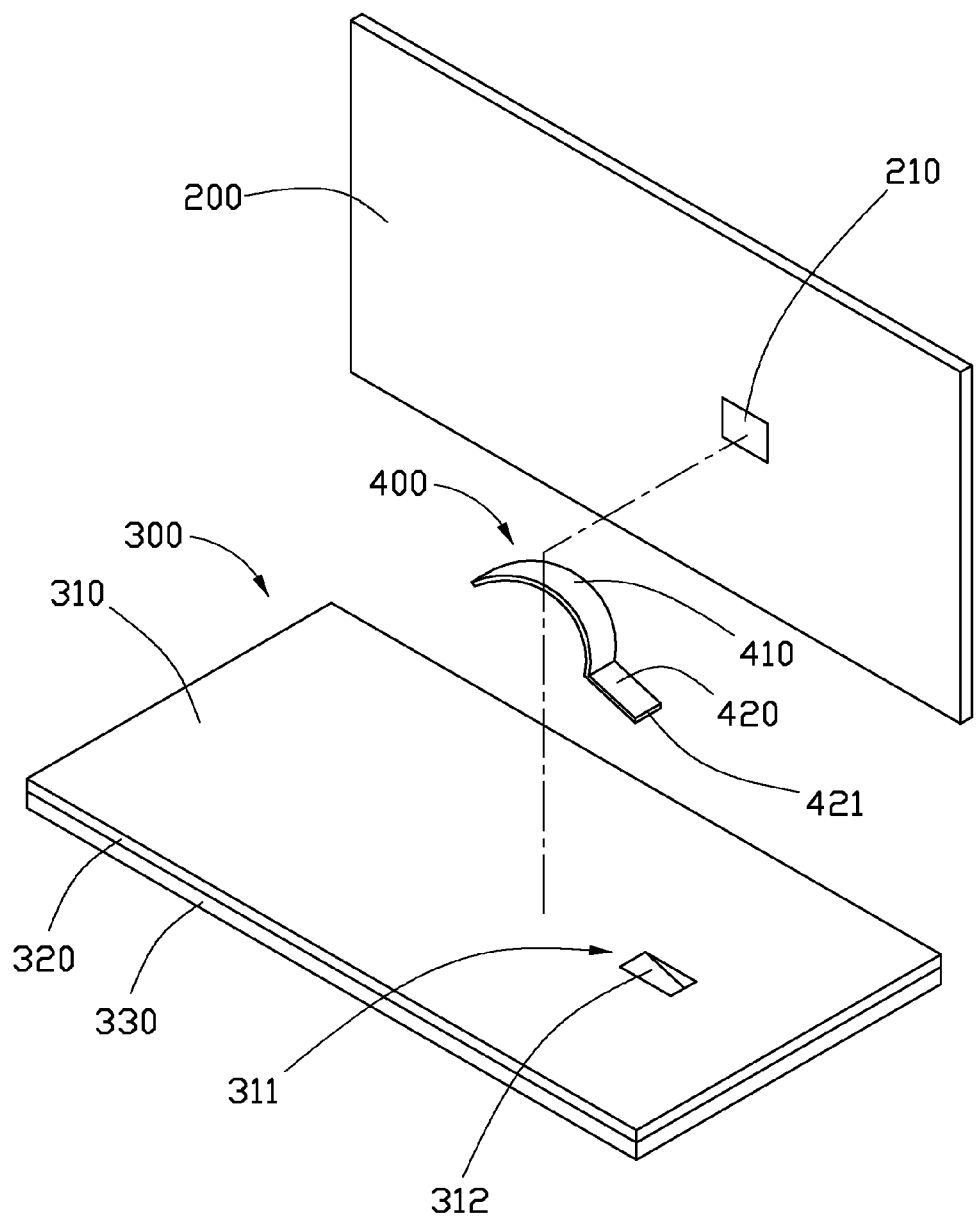
FIG. 2 is an exploded, isometric view of the electronic device of FIG. 1, with certain components omitted for clarity.

Referring to FIGS. 1 and 2, an electronic device 100 includes a circuit board 200, a conductive member 300, and a spring contact 400. The spring contact 400 is attached to the conductive member 300 and contacts the circuit board 200 to achieve grounding.

In the exemplary embodiment, the circuit board 200 includes a contacting area 210 coated with a layer of tin. The spring contact 400 contacts the contacting area 210 to achieve grounding. The spring contact 400 may, alternatively, be attached to the circuit board 200 and contacts the conductive member 300 to achieve grounding according to need.

Figure 3:
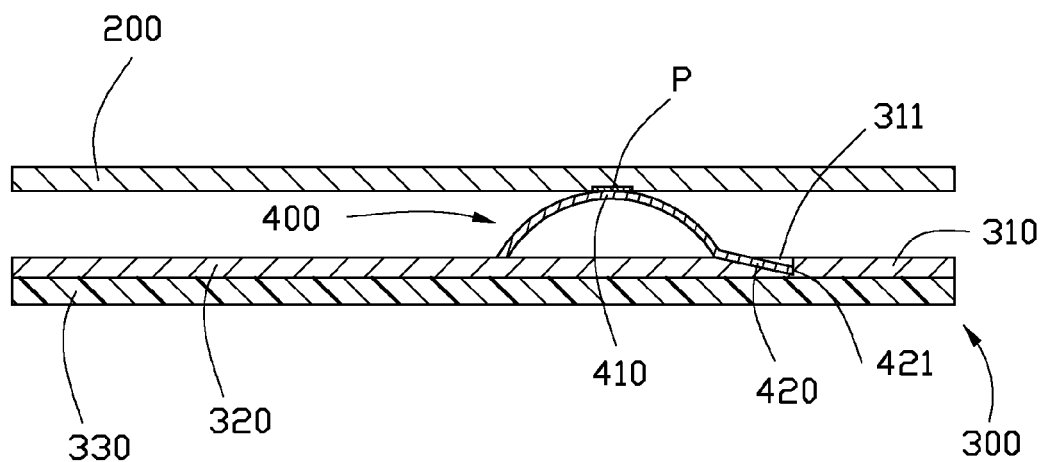
FIG. 3 is a cross-sectional view of the electronic device of FIG. 1, which is taken from line III-III of FIG. 1.

Referring to FIG. 3, the spring contact 400 includes an arc portion 410 and an angled portion 420 angled from the arc portion 410. One end of the arc portion 410 is fixed to the conductive member 300. The angled portion 420 includes a loose end 421 that is movable with respect to the conductive member 300. With such structure, a vertex P of the arc portion 410 contacting the circuit board 200 is allowed to move in a range greater than the case when the spring contact 400 is totally fixed to the conductive member 300, which ensures that the spring contact 400 achieves a tight contact with the circuit board 200.

In the exemplary embodiment, a surface 310 of the conductive member 300, which is arranged opposite to the circuit board 200, defines a recessed portion 311 that includes a sloped bottom surface 312. The angled portion 420 of the spring contact 400 is received in the recessed portion 311 and mates with the sloped surface 312, which allows that the angled portion 420 to be slidable in the recessed portion 311 along the sloped surface 312.

In the exemplary embodiment, the conductive member 300 includes an upper metal plate 320 and a lower plastic plate 330. The recessed portion 310 is formed through the metal plate 320. The angled portion 420 of the spring contact 400 is slidable to a position to engage the plastic plate 330.

Figure 4:
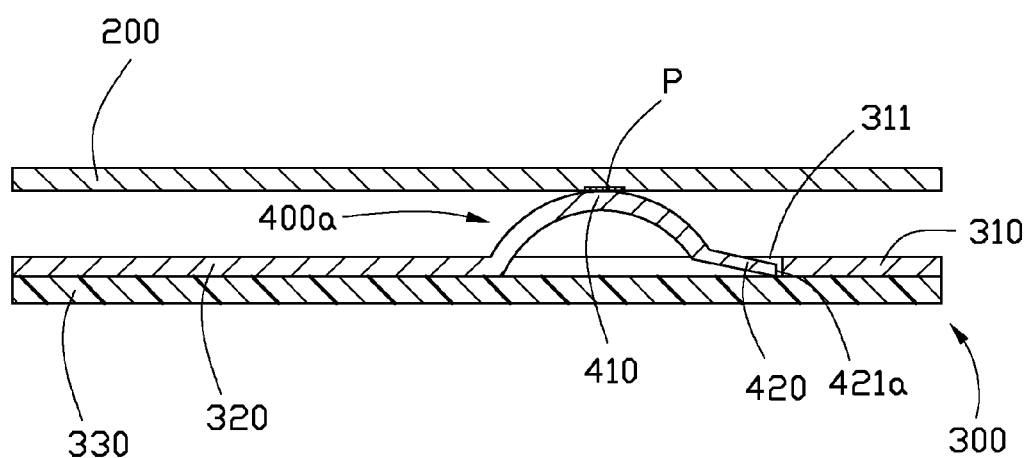
FIG. 4 is a cross-sectional view of the electronic device of FIG. 1, which is taken from line III-III of FIG. 1 and shows a spring contact in accordance with another embodiment.

Referring to FIG. 4, in another embodiment, a spring contact 400a can be integratedly formed with the conductive member 300 by stamping. The spring contact 400a protrudes from the surface 310 and contacts the circuit board 200 to achieve grounding. The spring contact 400a includes a loose end 421a, which ensures that the spring contact 400a achieves tight contact with the circuit board 200.

While various embodiments have been described and illustrated, the disclosure is not to be constructed as being limited thereto. Various modifications can be made to the embodiments by those skilled in the art without departing from the true spirit and scope of the disclosure as defined by the appended claims.

What is claimed is:

1. An electronic device comprising:
   a circuit board;
   a conductive member spaced from the circuit board and comprising a surface opposite to the circuit board, the surface defining a recessed portion, the recessed portion comprising a sloped surface; and
   a spring contact connected to the conductive member and contacting the circuit board to achieve grounding, wherein the spring contact comprises an end movably received in the recessed portion and mating with the sloped surface.

2. The electronic device according to claim 1, wherein the spring contact further comprises an arc portion, another end of the spring contact is fixed to the conductive member, and a vertex of the arc portion contacts the circuit board.

3. The electronic device according to claim 1, wherein the spring contact further comprises an arc portion and an angled portion angled from the arc portion.

4. The electronic device according to claim 1, wherein the conductive member further comprises an upper metal plate and a lower plate made of plastic material, the recessed portion is formed through the upper metal plate, and the end of the spring contact is slidable in the recessed portion to a position where the end of the spring contact engages the lower plate.

5. The electronic device according to claim 1, wherein the circuit board comprises a contacting area coated with a layer of tin, and the spring contact contacts the contacting area to achieve grounding.

6. An electronic device comprising:
   a circuit board;
   a conductive member spaced from the circuit board and comprising a surface opposite to the circuit board and a spring contact protruding from the surface, the spring contact contacting the circuit board to achieve grounding, wherein the spring contact comprises a loose end, the surface defines a recessed portion, the recessed portion comprises a sloped surface, and the loose end is movably received in the recessed portion and mates with the sloped surface.

7. The electronic device according to claim 6, wherein the spring contact further comprises an arc portion, and a vertex of the arc portion contacts the circuit board.

8. The electronic device according to claim 6, wherein the circuit board comprises a contacting area coated with a layer of tin, and the spring contact contacts the contacting area to achieve grounding.

9. The electronic device according to claim 6, wherein the conductive member further comprises an upper metal plate and a lower plastic plate, and the recessed portion is formed through the upper metal plate.

10. An electronic device comprising:
a circuit board comprising a contacting area coated with a layer of tin;
a conductive member spaced from the circuit board and comprising a surface opposite to the circuit board, the surface defining a recessed portion; and
a spring contact connected to the conductive member and contacting the contacting area of the circuit board to achieve grounding, wherein the spring contact comprises an end movably received in the recessed portion.

* * * * *